United States Patent
Matsushima (10) Patent No.: US 7,332,958 B2
(45) Date of Patent: Feb. 19, 2008

(54) ANALOG-DIFFERENTIAL-CIRCUIT TEST DEVICE

(75) Inventor: Yusuke Matsushima, Tokyo (JP)

(73) Assignee: NEC Corporation, Tokyo (JP)

( * ) Notice: Subject to any disclaimer, the term of this patent is extended or adjusted under 35 U.S.C. 154(b) by 137 days.

(21) Appl. No.: 11/374,733

(22) Filed: Mar. 14, 2006

(65) Prior Publication Data

US 2006/0208934 A1 Sep. 21, 2006

(30) Foreign Application Priority Data

Mar. 15, 2005 (JP) .............................. 2005-072471

(51) Int. Cl.
*H03F 3/45* (2006.01)
(52) U.S. Cl. ........................................... 330/2; 330/69
(58) Field of Classification Search .................. 330/2, 330/9, 51, 69
See application file for complete search history.

(56) References Cited

U.S. PATENT DOCUMENTS

| | | | |
|---|---|---|---|
| 6,046,632 A * | 4/2000 | Straw | 330/2 |
| 6,252,454 B1 * | 6/2001 | Thompson et al. | 330/9 |
| 7,026,865 B2 * | 4/2006 | Arguelles | 330/2 |

FOREIGN PATENT DOCUMENTS

JP 2001-133519 5/2001

\* cited by examiner

*Primary Examiner*—Steven J. Mottola
(74) *Attorney, Agent, or Firm*—Scully, Scott, Murphy & Presser, P.C.

(57) ABSTRACT

An analog-differential-circuit test device includes transfer gates 13 and 14 for isolating in the test mode an input pair of an analog differential circuit from input nodes IN and INB, a voltage adjusting circuit for generating a voltage pair controlled by a control signal fed from outside of the LSI and input to the input pair during the test mode, and a flip-flop for latching an output from the analog differential circuit. A High-output input characteristic and a Low-output input characteristic of the analog differential circuit itself are measured in the LSI.

7 Claims, 6 Drawing Sheets

ANALOG-DIFFERENTIAL-CIRCUIT TEST DEVICE

BACKGROUND OF THE INVENTION

1. Field of the Invention

The present invention relates to an analog-differential-circuit test device and, more particularly, to a test device for testing an analog differential circuit such as a differential amplifier.

2. Description of the Related Art

In recent years, LSIs include an analog differential circuit such as a current-mode-logic (CML) circuit in place of a conventional CMOS circuit because of achieving a higher-speed operation as well as a follow-up capability for power source fluctuation. In general, the analog differential circuit has a property that a DC characteristic easily changes due to variation of process conditions used in manufacturing transistors in the analog differential circuit. The term "DC characteristic" as used herein includes a High-output input characteristic, i.e., the behavior of the analog differential circuit by which an input voltage difference causes the analog differential circuit to assume a H-level output especially in the vicinity of a signal transition to a low level, and a Low-output input characteristic, i.e., the behavior of the analog differential circuit by which an input voltage difference causes the analog differential circuit to assume a L-level especially in the vicinity of a signal transition to a high level.

For the reason as described above, there is a request to attempt to measure and analyze the DC characteristic of the analog differential circuit in the LSI. However, unless input and output of the analog differential circuit are directly connected to input and output terminals, respectively, of the LSI, it is difficult to measure and analyze the characteristic of the analog differential circuit itself.

Conventionally, operation of the analog differential circuit in the LSI has been tested in a functional test of a combinational circuit in a higher-order level configuration including the differential circuit. For example, Patent Publication JP-A-2001-133519 describes such a test circuit. However, it is desired that accuracy of the inspection and analysis be improved by testing and analyzing the differential circuit in a lower-order level circuit configuration.

SUMMARY OF THE INVENTION

In consideration of the above, it is an object of the present invention to provide a built-in type analog-differential-circuit test device capable of measuring and analyzing the DC characteristic of an analog differential circuit that has input and output not directly connected to external pins of a LSI.

The present invention provides an analog-differential-circuit test device installed in a LSI including an analog differential circuit, including: a switching device for switching an input pair of the analog differential circuit between a normal operation mode and a test mode; a voltage adjusting block controlled by a control signal input from outside of the LSI for generating a voltage pair, to feed the voltage pair to the input pair of the differential circuit; and a latch gate for latching an output from the analog differential circuit.

In accordance with the analog-differential-circuit test device of the present invention, the analog differential circuit disposed in the LSI can be measured and analyzed in the DC characteristic thereof as the DC characteristic of a single analog differential circuit.

In a preferred embodiment of the analog differential circuit of the present invention, the voltage pair includes a first voltage controlled by the control signal from a maximum voltage to a minimum voltage thereof, and a second voltage controlled by the control signal from a minimum voltage to a maximum voltage thereof, and the first voltage and the second voltage cross each other between the maximum voltage and the minimum voltage of one of the first and second voltages. In this case, the potentials of the input pair cross each other by changing the voltage control signal in one direction, whereby the test procedure for the analog differential circuit can be simplified.

It is also a preferred embodiment of the present invention that the voltage adjusting block includes: a plurality of first current paths each connected between a high-potential power source line and one of the input pair and including a pull-up resistor and a first transistor; a plurality of second current paths each connected between a low-potential power source line and the one of the input pair and including a pull down transistor and a second transistor; a plurality of third current paths each connected between the high-potential power source line and the other of the input pair and including a pull-up resistor and a third transistor; and a plurality of fourth current paths each connected between the low-potential power source line and the other of the input pair and including a pull-up resistor and a fourth transistor. The circuit configuration of the test device can be formed together with the functional circuit generally used in the LSI.

It is also a preferred embodiment that the control signal includes first and second control signals each including a same number of bits, the first and fourth transistors are controlled by the first control signal, the second and third transistors are controlled by the second control signal. In this case, the voltage applied to the input pair can be adjusted by changing bits of the control signal.

It is also preferable that the first and second control signals be controlled independently of each other. In an alternative, the first and second control signals may be complementary signals.

It is also a preferred embodiment of the present invention, the test device further includes a comparator for comparing one of the voltage pair against a reference voltage. In this case, finer measurement and analysis may be possible.

DETAILED DESCRIPTION OF THE PREFERRED EMBODIMENTS

Figure 1:
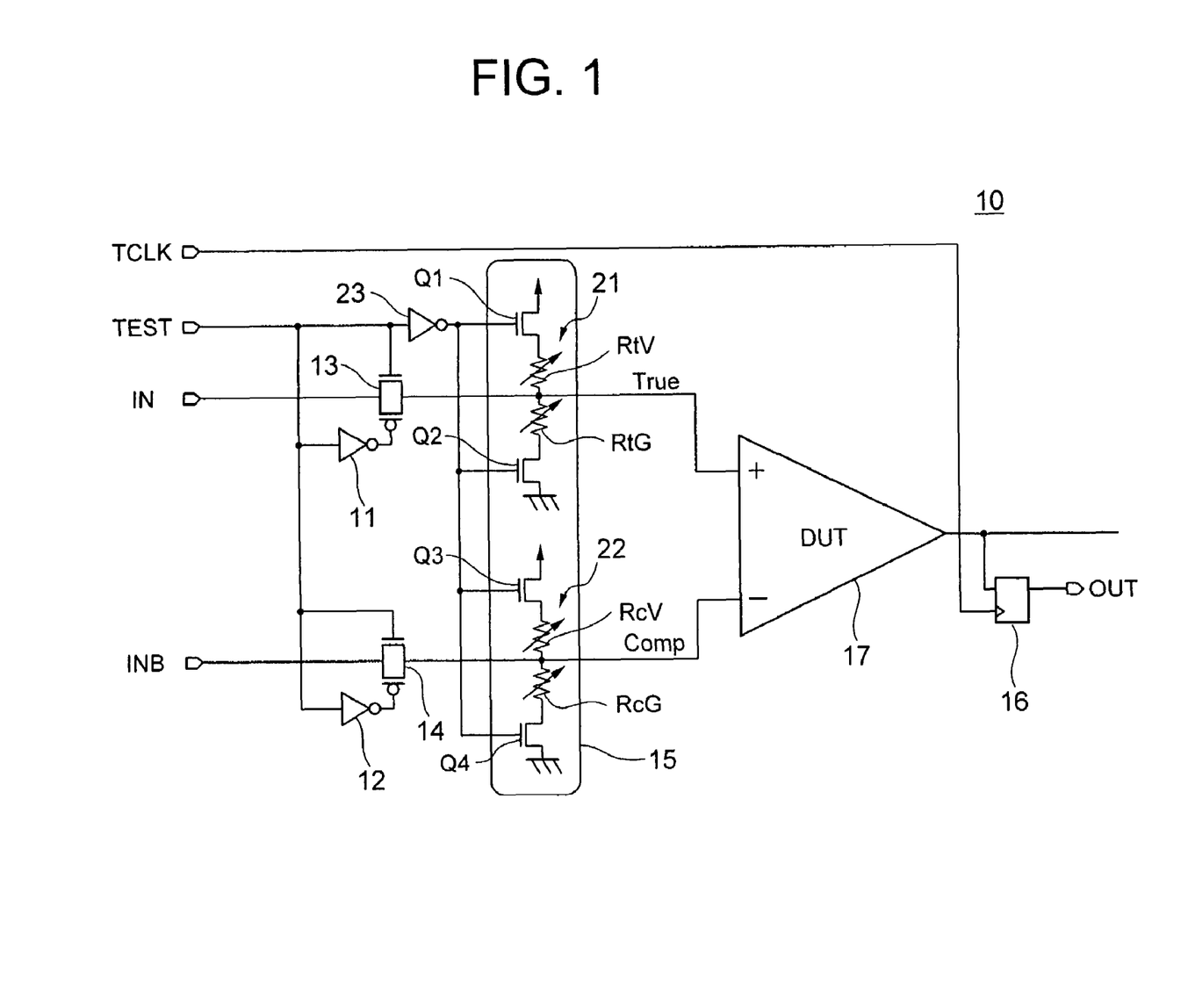
FIG. 1 is a circuit diagram showing a basic structure of an analog-differential-circuit test device according to the principle of the present invention.

Referring to the drawings, embodiments of the present invention will now be described in more detail. FIG. 1 shows a basic structure of an analog-differential-circuit test device according to the principle of the present invention together with an analog differential circuit 17 under test. The test device, generally designated by numeral 10, has a test terminal TEST that receives a test signal for connecting the circuit under test (DUT) 17 in a test mode thereof, inverters 11, 12 and 23 for transmitting test signals, transfer gates 13 and 14 that isolate the input pair of the DUT 17 including a True terminal (non-inverting terminal) and a Comp terminal (inverting terminal) from the input nodes IN and INB, respectively, of the normal operation mode during a test mode, a voltage adjusting block 15 that has a Thevenin resistor configured by variable resistors RtV, RtG, RcV, RcG each having the same maximum resistance and the same minimum resistance and being set at a suitable resistance for adjusting the potentials of the True terminal and Comp terminal during the test mode, and a flip-flop 16 for latching an output from the DUT 17 in response to a clock signal TCLK. The test device 10 is, for example, used to measure and analyze an input voltage difference by which the output voltage of the analog differential circuit 17 is inverted.

The voltage adjusting block 15 includes a first adjusting section 21 for adjusting the potential on the True terminal, and a second adjusting section 22 for adjusting the potential on the Comp terminal. The first adjusting section 21 is provided with an n-channel transistor Q1 and a pull-up resistor RtV connected between a high-potential power source and the True terminal of the DUT 17, and an n-channel transistor Q2 and a pull-down resistor RtG connected between a low-potential power source and the True terminal. The second adjusting section 22 is provided with an n-channel transistor Q3 and a pull-up resistor RcV connected between the high-potential power source and the Comp terminal of the DUT 17, and an n-channel transistor Q4 and a pull-down resistor RcG connected between the low-potential power source and the Comp terminal. The resistance of the pull-up resistors and the pull-down resistors is adjusted from outside of the test device 10, i.e., the LSI.

In the analog-differential-circuit test device 10 of the above embodiment, a TEST signal is first set at a L-level for testing, whereby the transfer gates 13 and 14 are turned off, and thus the input pair of the DUT 17 are isolated from the input nodes IN and INB which are used in the normal operation mode of the LSI. Then, the Thevenin resistor in the voltage adjusting block 15 is adjusted, to gradually raise the potential on the True terminal of the DUT 17 from the lower power-source potential (ground potential) to the higher power-source potential (VDD potential). At the same time, the potential on the Comp terminal of the DUT 17 is gradually lowered from the VDD potential to the ground potential. Thus, the potentials of the input pair of the DUT 17 cross each other during the adjustment of the potentials, which are detected by observing the output from the flip-flop 16. The voltage characteristic of the DUT 17 before the potentials of both the input pair cross each other is analyzed as a High-output input characteristic, and the voltage characteristic of the DUT 17 after the input pair cross each other is analyzed as a Low-output input characteristic.

After the test is finished, the transfer gates 13 and 14 are turned on by setting the TEST signal from the L-level to a H-level, whereby the input pair of the DUT 17 are connected to the input node IN and INB, respectively, in the LSI. This allows the predetermined normal operation to be performed in the normal mode of the LSI including the analog differential circuit.

Figure 2:
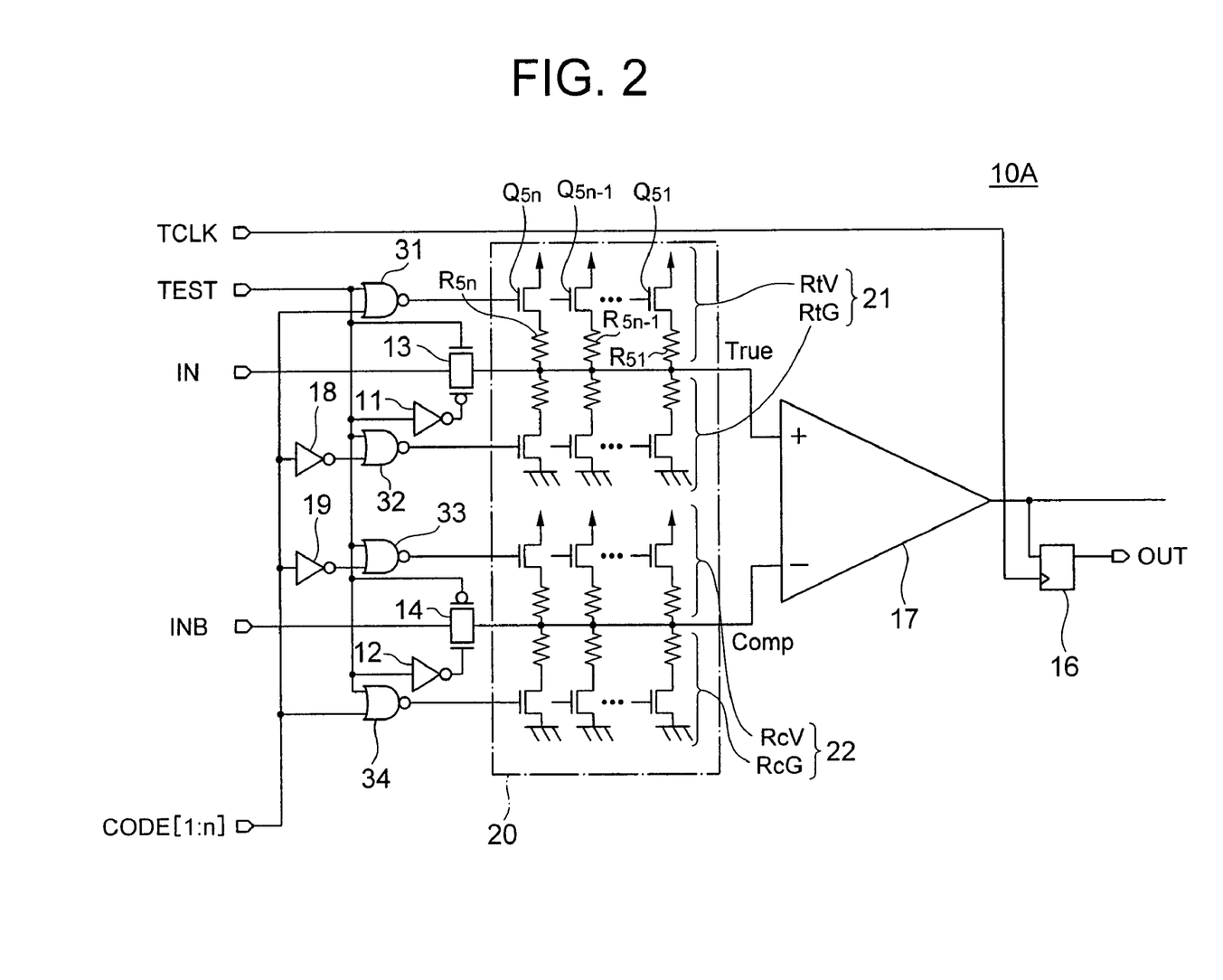
FIG. 2 is a circuit diagram of the analog-differential-circuit test device according to a first embodiment of the present invention.

FIG. 2 is a circuit diagram of a practical test device 10A according to a first embodiment of the present invention, showing an example of the analog-differential-circuit test device of FIG. 1. Based on the test device 10A, the structure and operation of the test device of FIG. 1 will be specifically described. In FIG. 2, the voltage adjusting block includes an external input terminal for inputting an n-bit control signal CODE[1:n], inverters 18 and 19 for transmitting the control signal CODE[1:n], NOR gates 31 to 34 into which the control signal CODE[1:n] or complementary signal thereof and the TEST signal are input, and a voltage adjusting circuit 20 including a first adjusting section 21 and a second adjusting section 22 controlled by outputs from the NOR gates 31 to 34.

On the pull-up side and the pull-down side of the adjusting sections 21 and 22, a plurality (n) of current paths each of which has a resistor R51, R52, . . . or R5n and a transistor Q51, Q52, . . . or Q5n are connected between the input terminal of the DUT 17 and the power source line. In this configuration, resistances of the n current paths included in the respective variable resistors (Thevenin resistors) RtV, RtG, RcV and RcG are defined to include therein ON-resistance of the respective transistors Q51, Q52, . . . Q5n. The transistors disposed in the respective current paths corresponding to the respective bits are controlled for ON/OFF thereof by the n-bit control signal CODE[1:n]. That is, if the CODE[k] is "1", the transistor in the current path of k-th row in the n current paths is turned on. Thus, assuming that the resistance in the current path of the CODE[1] is R, the resistance in the current path (k=1 to n) of the CODE[k] has a weight of R/k.

Figure 3:
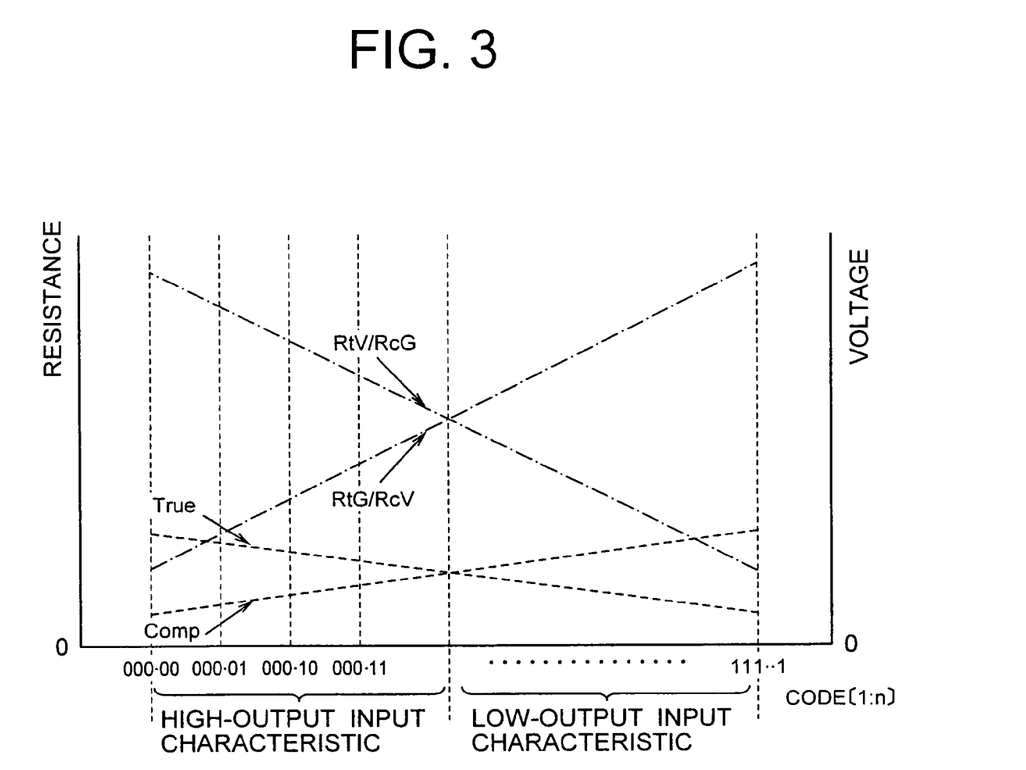
FIG. 3 is a graph showing the relationship between the voltage control signal and resistance as well as voltage of the voltage adjusting block in the test device of FIG. 2.

In the above configuration, the analog-differential-circuit test device 10A of the present embodiment operates in the normal mode in case of TEST=1, and operates in the test mode in case of TEST=0. FIG. 3 shows an operation of the voltage adjusting circuit 20 in the test mode by using the relationship between the bits of the control signal CODE[1:n] and the resistances of the Thevenin resistors RtV, RcV and RcG, as well as the bits of the control signal CODE[1:n] and potentials on the True/Comp terminals.

Since the resistance of the Thevenin resistor RtV assumes minimum and the resistance of the Thevenin resistor RtG assumes maximum when all the bits of the control signal are 0 (i.e., CODE[1:n]=00..00), the potential on the True terminal assumes a minimum. At this time, since the control signal for the Thevenin resistors RcV and RcG are compliment of that for the Thevenin resistors RtV and RtG, respectively, the resistance of the RcV assumes a maximum and the resistance of the RcG assumes a minimum, and the potential on the Comp terminal assumes a minimum. Thus, the input potential difference applied to the DUT 17, which is the potential on the True terminal minus the potential on the Comp terminal, assumes a maximum.

Next, the resistance of the Thevenin resistor RtV is increased and the resistance of the Thevenin resistor RtG is decreased by count-up of the control signal CODE[1:n] one by one from 00..00 to 00..01, 00..10, 00..11, . . . , whereby the potential on the True terminal falls. Similarly, the resistance of the Thevenin resistor RcV falls and resistance of the Thevenin resistor RcG rises by the count-up of the control signal, whereby the potential on the Comp terminal rises. As a result, the input potential difference of the DUT 17 is gradually lowered. At any time the control signal CODE[1:n] is counted up, the output from the DUT 17 is observed through the output of the flip-flop 16, and thereby, a HIGH-output input characteristic, which represents the maximum input difference that provides a H-level output for the DUT 17, can be obtained. The resistance of the Thevenin resistors has an almost linear characteristic to the value represented by the codes of the control signal CODE[1:n], which adjusts the resistance of the current path of the CODE[k] at R/k.

As the CODE[1:n] is counted up one by one, the potentials on the True terminal and the Comp terminal are reversed in the magnitude thereof, wherein a Low-output input difference is obtained. During this procedure, at any time the CODE[1:n] is counted up, the input difference in the negative polarity is increased, and the Low-output input characteristic, which represents the minimum input difference that provides a low output for the DUT 17, can be obtained.

In a LSI including a plurality of analog differential circuits, the judgment flip-flop 16 is provided for each of the analog differential circuits disposed in the LSI, if the each of analog differential circuits 17 is to be scanned and observed one by one. In alternative, a single flip-flop 16 may be provided common to a plurality of analog differential circuits 17 in the LSI if the analog differential circuits are selected one by one by using a selecting signal.

Figure 4:
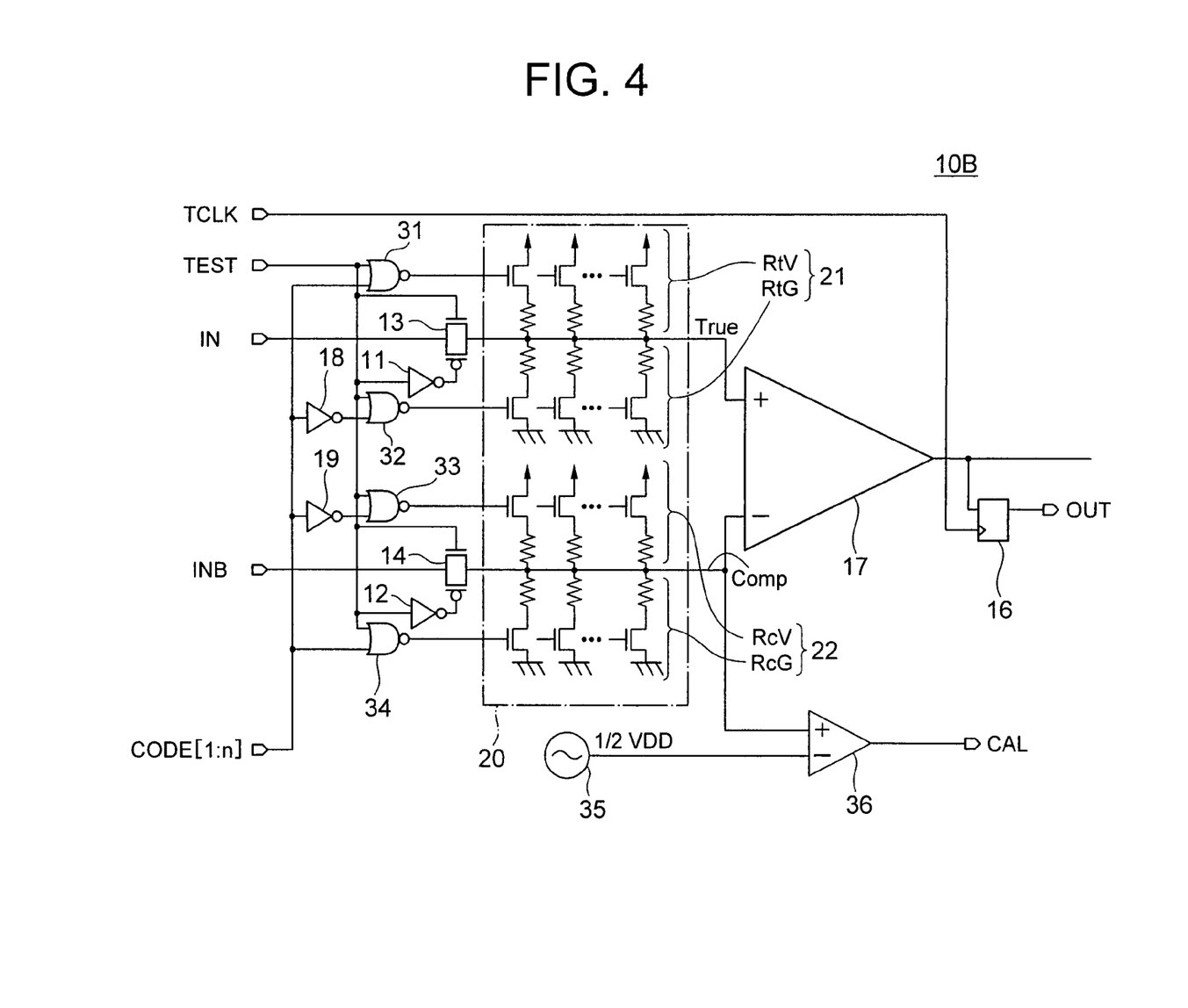
FIG. 4 is a circuit diagram of an analog-differential-circuit test device according to a second embodiment of the present invention.

FIG. 4 shows a circuit diagram of an analog-differential-circuit test device 10B according to a second embodiment of the present invention. The difference between the present embodiment and the first embodiment is that a comparator 36 is provided in the present embodiment for comparing the potential on the Comp terminal of the DUT 17 with a reference voltage which is half the VDD potential, in addition to a power source circuit 35 generating the VDD/2 potential. The comparator 36 outputs the result of comparison as a CAL signal.

Figure 5:
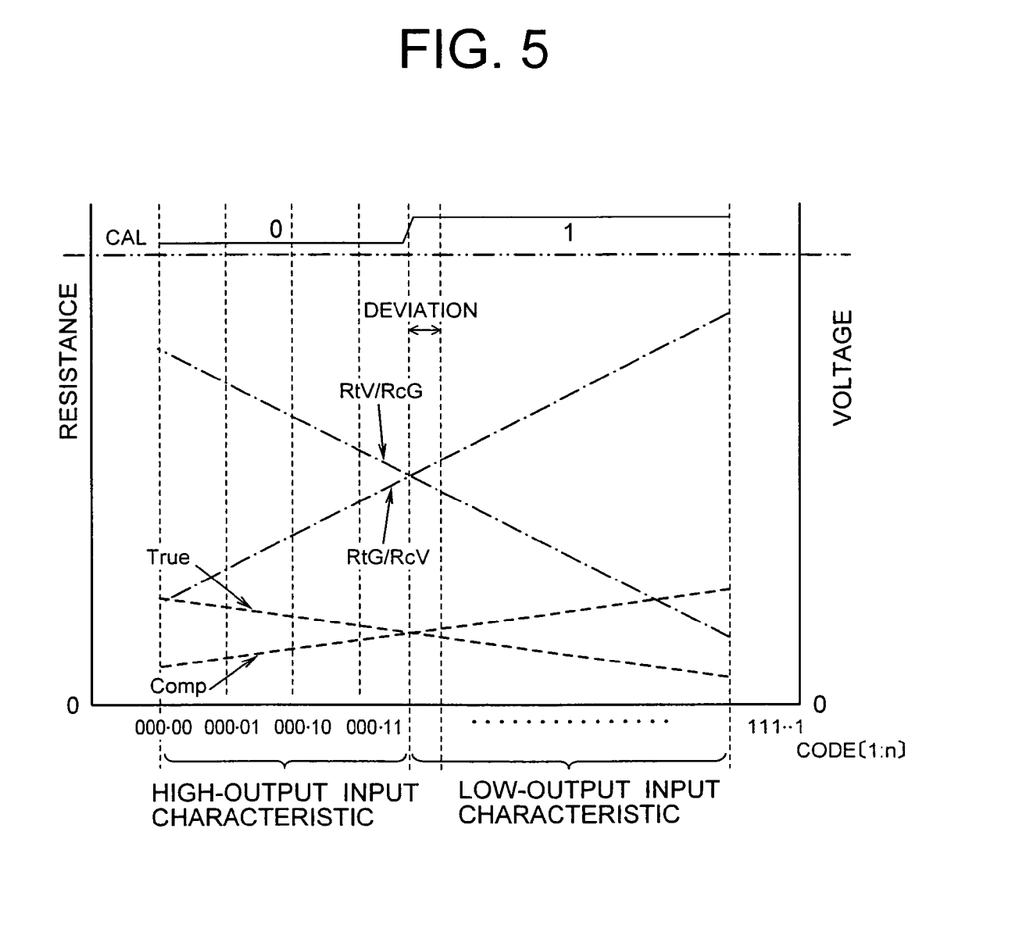
FIG. 5 is a graph showing the relationship between the voltage control signal and resistance, and between the voltage control signal and voltage of the voltage adjusting block in the test device of FIG. 4.

In the first embodiment, it is assumed that, when the control signal which controls the resistance of the pull-up resistors and pull-down resistors has a median value, the pull-up resistors and pull-down resistors assume the same resistance, and the potentials on the True terminal and the Comp terminal assume a half potential with respect to the power source voltage VDD. However, if the resistance of any of the resistors in the Thevenin resistor deviates from the design resistance due to a difference in process conditions, the value of the control signal, which controls the potentials on the True terminal and the Comp terminal to be VDD/2, deviates from the median value. FIG. 5 shows this situation. In this respect, the present embodiment can exactly control the potentials on the True terminal and the Comp terminal in the vicinity of VDD/2 by using the power source circuit 35 generating a VDD/2 voltage and the comparator 36, thereby allowing a more precise test to be conducted on the DUT 17.

Figure 6:
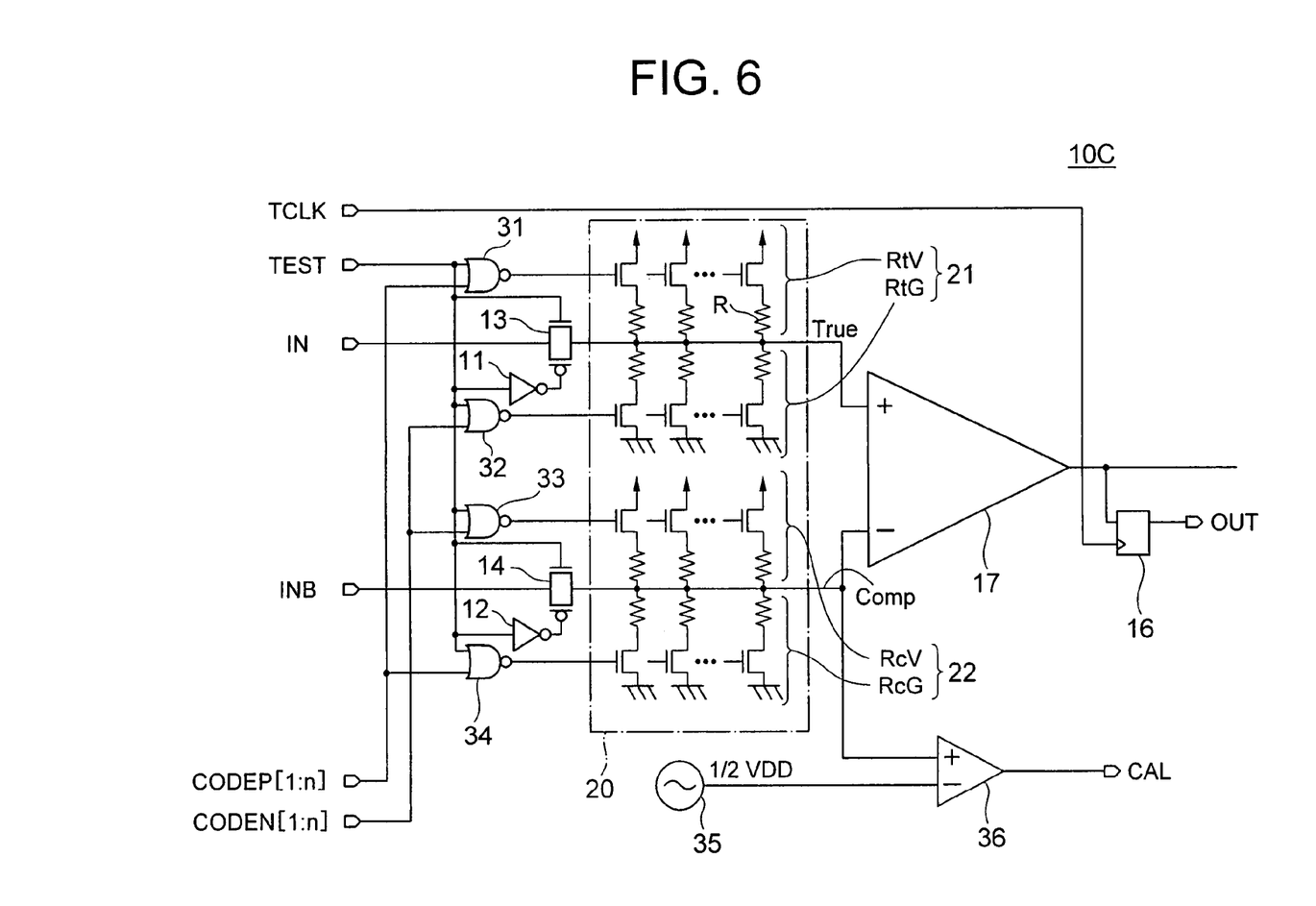
FIG. 6 is a circuit diagram of an analog-differential-circuit test device according to a third embodiment of the present invention.

FIG. 6 is a circuit diagram of an analog-differential-circuit test device 10C according to a third embodiment of the present invention. In this embodiment, in addition to the structure of the second embodiment, the control signal CODE[1:n] which adjusts the Thevenin resistor is divided into a CODEP signal and a CODEN signal, which are input as control signals for the pull-up resistors and the pull-down resistors. It is to be noted that the structure of this embodiment can be employed in addition to or independently from the structure of the second embodiment.

In a typical test mode, the CODEP signal and the CODEN signal are controlled as complementary signals, to thereby operate the test device 10B similarly to the second embodiment. In the present embodiment, in a specific test mode, the CODEP signal and the CODEN signal may be adjusted independently from each other, thereby allowing a more exact test.

More specifically, in the test mode, complementary values are input into the values of the CODEP[1:n] and CODEP[1:n], and are counted up or counted down at the same time. When the output CAL signal from the comparator 36 changes the level of the output, the output from the Thevenin resistor will be VDD/2 and the resistance of the pull-up resistor and the pull-down resistor will be the same value. Thereafter, one of the control signals is changed in consideration of variation in the resistances, wherein the High-output input characteristic is investigated for the CODE before the signal transition of the DUT 17, and the Low-output input characteristic is investigated for the CODE after the signal transition.

The present invention has been described above based on the preferred embodiments thereof. However, the analog-differential-circuit test device according to the present invention is not limited only to the structures described in the above embodiments. The scope of the present invention should be considered as including those test devices that would be derived by making various changes and modifications to the structures of the above embodiments. Furthermore, the respective structures described as the preferred embodiments and the respective structures described in the embodiments are preferably used together with the essential structure of the present invention. However, it is not necessary for a structure which achieves beneficial effect even by itself to be used together with all of the structure as essential structures of the present invention.

What is claimed is:

1. An analog-differential-circuit test device installed in a LSI including an analog differential circuit, comprising:
   a switching device for switching an input pair of the analog differential circuit between a normal operation mode and a test mode;
   a voltage adjusting block controlled by a control signal input from outside of the LSI for generating a voltage pair, to feed said voltage pair to the input pair of the differential circuit; and
   a latch gate for latching an output from the analog differential circuit.

2. The analog-differential-circuit test device according to claim 1, wherein said voltage pair includes a first voltage controlled by said control signal from a maximum voltage to a minimum voltage thereof, and a second voltage controlled by said control signal from a minimum voltage to a maximum voltage thereof, and said first voltage and said second voltage cross each other between said maximum voltage and said minimum voltage of one of said first and second voltages.

3. The analog-differential-circuit test device according to claim 1, wherein said voltage adjusting block includes:
   a plurality of first current paths each connected between a high-potential power source line and one of the input pair and including a pull-up resistor and a first transistor;
   a plurality of second current paths each connected between a low-potential power source line and said one of the input pair and including a pull down transistor and a second transistor;
   a plurality of third current paths each connected between said high-potential power source line and the other of the input pair and including a pull-up resistor and a third transistor; and a plurality of fourth current paths each connected between said low-potential power source line and the other of the input pair and including a pull-up resistor and a fourth transistor.

4. The analog-differential-circuit test device according to claim 3, wherein said control signal includes first and second control signals each including a same number of bits, said first and fourth transistors are controlled by said first control signal, said second and third transistors are controlled by said second control signal.

5. The analog-differential-circuit test device according to claim 4, wherein said first and second control signals are controlled independently of each other.

6. The analog-differential-circuit test device according to claim 4, wherein said first and second control signals are complementary signals.

7. The analog-differential-circuit test device according to claim 1, further comprising a comparator for comparing one of said voltage pair against a reference voltage.

* * * * *